(12) United States Patent
Katyal

(10) Patent No.: US 12,537,514 B1
(45) Date of Patent: Jan. 27, 2026

(54) PROGRAMMABLE CIRCUIT TO CANCEL FREQUENCY DRIFT

(71) Applicant: Cadence Design Systems, Inc., San Jose, CA (US)

(72) Inventor: Amit Katyal, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 18/639,158

(22) Filed: Apr. 18, 2024

(51) Int. Cl.
*H03K 3/011* (2006.01)
*H03K 17/687* (2006.01)

(52) U.S. Cl.
CPC ......... *H03K 3/011* (2013.01); *H03K 17/6871* (2013.01)

(58) Field of Classification Search
CPC ...... H03K 3/011; H03K 17/14; H03K 17/687; H03K 17/6871; G05F 3/225; G05F 3/26; G05F 3/267; G05F 3/30

USPC .................................................. 327/513, 539
See application file for complete search history.

(56) References Cited

U.S. PATENT DOCUMENTS 7,208,930 B1 * 4/2007 Tran .......................... G05F 3/30
323/907

* cited by examiner

*Primary Examiner* — Hai L Nguyen
(74) *Attorney, Agent, or Firm* — Mark H. Whittenberger, Esq.; Holland & Knight LLP

(57) ABSTRACT

Embodiments included herein are directed towards a programmable circuit. The circuit may include a current source configured to provide a constant bias current and a transistor configured to receive a first portion of the constant bias current. The circuit may further include a first resistor operatively connected with the transistor and a second resistor configured to receive a second portion of the constant bias current, where a voltage associated with the transistor is reduced as temperature increases.

14 Claims, 11 Drawing Sheets

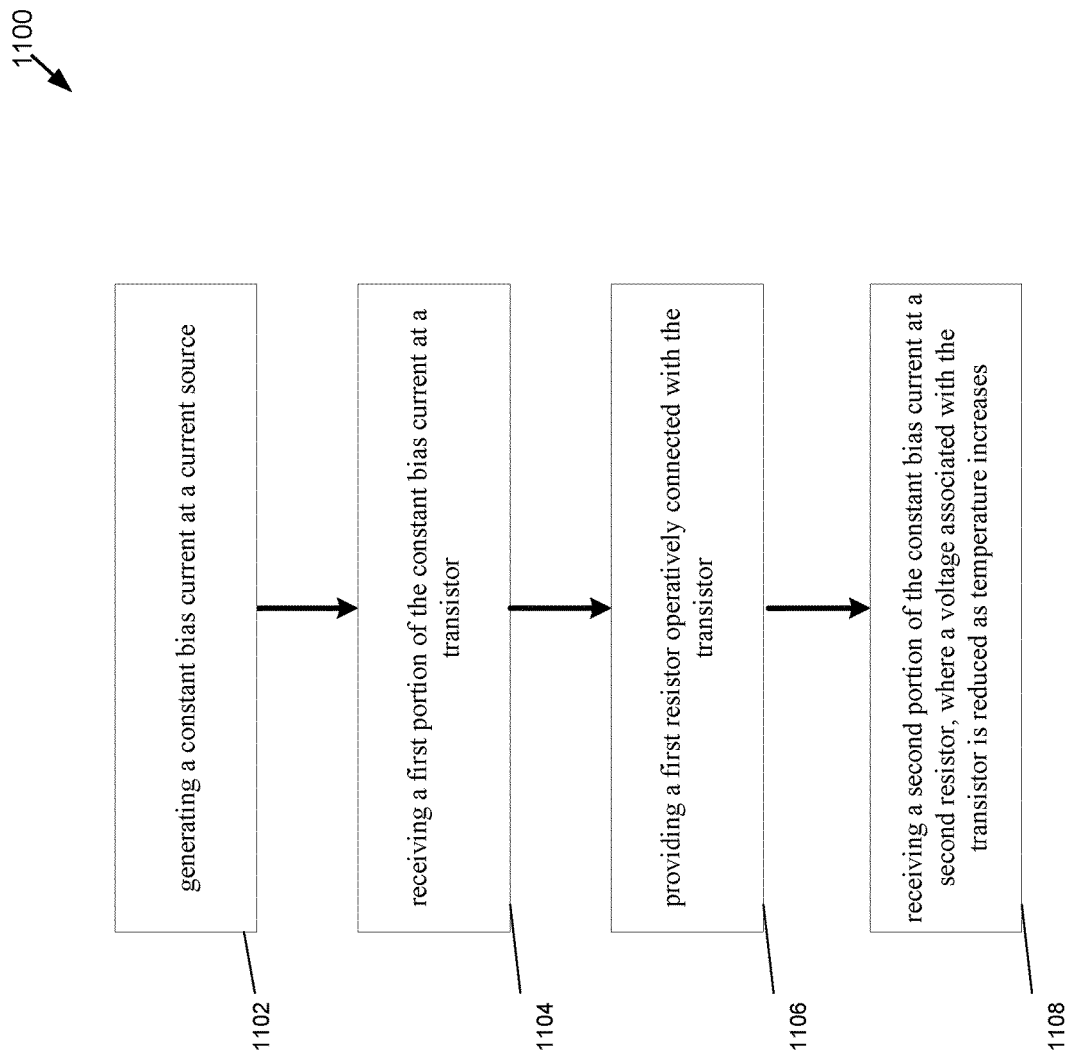

PROGRAMMABLE CIRCUIT TO CANCEL FREQUENCY DRIFT

FIELD OF THE INVENTION

The present disclosure relates to electronic circuits, and more particularly, to a programmable circuit to cancel frequency drift as may be present in voltage-controlled oscillators (VCOs).

BACKGROUND

Very accurate or spectrally pure signals are needed in many applications in modern integrated circuit design. The spectral purity and the timing accuracy are just two ways of looking at the same characteristic of the signal. Spectral purity is a frequency domain measurement and jitter is a time domain measurement, however, these terms may be used interchangeably. One way to produce a low jitter signal on a chip is to use an on-chip LC (inductor-capacitor) tank oscillator.

The basic oscillator consists of a LC tank that sets the operating frequency of the signal, and an amplifier to make up for signal losses in the LC tank and to drive the signal to-the next stage. The frequency and the phase of the oscillator may be maintained with a phase locked loop (PLL), where the phase and frequency of the signal output by the oscillator may be compared to an external reference signal. Adjustments to drifts in phase or frequency of the oscillator may be made by the PLL through a voltage control pin. This structure is known as a voltage-controlled oscillator (VCO).

Desirable characteristics of the VCO are often wide frequency tuning range, low power dissipation, low phase noise or jitter, low sensitivity to the power supply voltage, stable output voltage, low harmonic content, small physical size, and a relatively simple design.

The frequency of the oscillator may be tuned with a device such as a voltage variable capacitor (varactor), that may be included as part of the capacitance of the tank. The oscillation may be generated by noise in the amplifier, or the LC tank being amplified by the amplifier, and filtered by the tank to cause an exponentially growing sinusoidal oscillation at the tank frequency.

Oscillation may occur when the amplifier characteristics (gain in units of transconductance—Iout/Vin), in conjunction with the tank impedance, produce a gain greater than unity. The amplitude of the oscillation is limited either by the amplifier running out of voltage swing room or current drive to the tank. In the interest of maintaining the lowest harmonic content, the least sensitivity to the power supply voltage, and the lowest possible power dissipation practical with on-chip inductor values, the amplitude is usually limited by the available drive current of the amplifier. It may be shown that the equivalent impedance of the tank varies with the square of the frequency. For a given drive current, the amplitude of the steady state sine wave varies with the square of the tuning range. In addition, the effective gain of the loop varies with the square of the tuning range. For wide tuning range VCOs, this causes numerous problems.

For example, if the gain (transconductance) of the amplifier is set high enough to ensure that the oscillation will build up at the lowest frequency, the power dissipation at higher frequencies is higher than desired. Also, the amplitude to frequency conversion process converts amplitude noise either from thermal sources or supply induced to phase noise and jitter.

SUMMARY

In one or more embodiments of the present disclosure, a programmable circuit is provided. The circuit may include a current source configured to provide a constant bias current and a transistor configured to receive a first portion of the constant bias current. The circuit may further include a first resistor operatively connected with the transistor and a second resistor configured to receive a second portion of the constant bias current, where a voltage associated with the transistor is reduced as temperature increases.

One or more of the following features may be included. The second portion of the constant bias current may be reduced as temperature increases. The first portion of the constant bias current may be increased as temperature increases. A voltage proportional to absolute temperature at a node operatively connected with the transistor and first resistor may increase as temperature increases. The voltage proportional to absolute temperature may be adjusted by altering a value of the first resistor. The voltage proportional to absolute temperature may be adjusted by altering a value of the second resistor. The programmable circuit may receive a current from a secondary current source. The programmable circuit may be operatively connected with a varactor. The varactor may be operatively connected with a third current source and a charge pump. The varactor may be operatively connected with a third resistor that is operatively connected with a second transistor.

In one or more embodiments of the present disclosure, a method for use with a programmable circuit is provided. The method may include generating a constant bias current at a current source and receiving a first portion of the constant bias current at a transistor. The method may further include providing a first resistor operatively connected with the transistor and receiving a second portion of the constant bias current at a second resistor, where a voltage associated with the transistor is reduced as temperature increases.

One or more of the following features may be included. The second portion of the constant bias current may be reduced as temperature increases. The first portion of the constant bias current may be increased as temperature increases. A voltage proportional to absolute temperature at a node operatively connected with the transistor and first resistor may increase as temperature increases. The voltage proportional to absolute temperature may be adjusted by altering a value of the first resistor. The voltage proportional to absolute temperature may be adjusted by altering a value of the second resistor. The programmable circuit may receive a current from a secondary current source. The programmable circuit may be operatively connected with a varactor. The varactor may be operatively connected with a third current source and a charge pump. The varactor may be operatively connected with a third resistor that is operatively connected with a second transistor.

In yet another embodiment of the present disclosure a programmable circuit is included. The circuit may include a first current source configured to generate a complementary to absolute temperature current and a second current source configured to generate a constant bias current. The circuit may further include a current mirror configured to receive the complementary to absolute temperature current and a first portion of the constant bias current. The circuit may also include a resistor configured to receive a second portion of the constant bias current. The current mirror may be programmable.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 11 shows a flowchart showing operations consistent with embodiments of the present disclosure.

DETAILED DESCRIPTION

Figure 1:
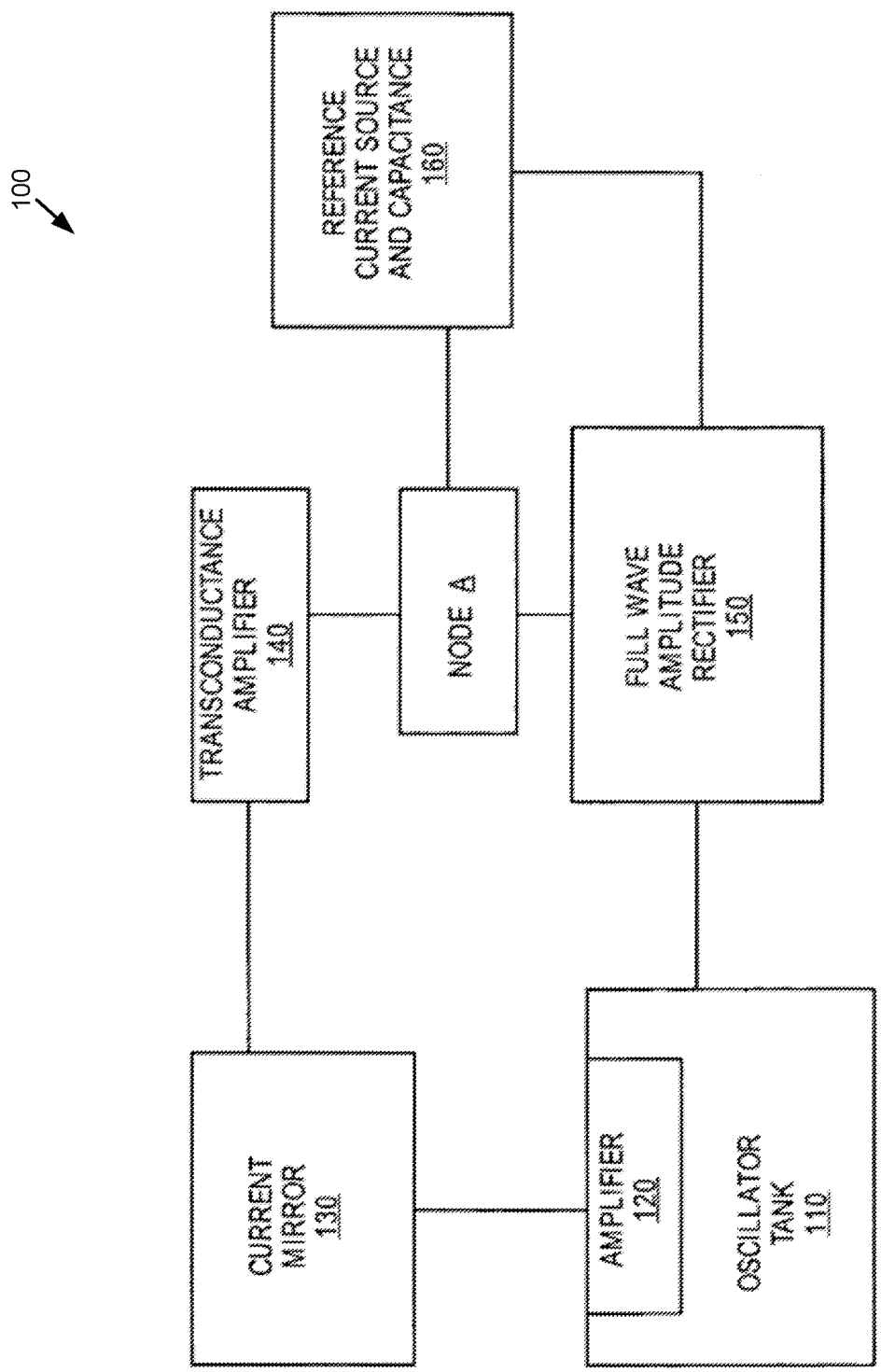
FIG. 1 shows an example of a voltage-controlled oscillator system consistent with embodiments of the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. Like reference numerals in the drawings denote like elements.

As used in any embodiment described herein, "circuit" or "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

In one example, amplitude control loop circuit as shown in FIG. 1 may control the amplitude of a voltage-controlled oscillator (VCO) using a control circuit that provides a dominant pole, a filtering function, rectification, and a gain at a single node of the circuit. Rectifier 150 output may be integrated at node A to provide a dominant pole for the circuit. The circuit may regulate the current of the amplifier 120 in oscillator tank 110 based on a comparison of an output of a full wave rectifier 150 to a fixed reference 160 at the single node A. The comparison may produce a sum or a difference of the two currents, which creates a voltage signal at node A.

For example, if the amplitude of the signal that is output of the VCO is lower than desired, then the voltage level at node A rises, because the reference current signal 160 may be larger than the representative oscillator current signal. If the amplitude of the oscillating signal is too high, then the voltage at node A may be pulled down, because the current signal that is output of the rectifier 150 may be greater than the reference current signal. If the amplitude of the oscillating signal is correct, then the voltage at node A may be balanced by the reference current signal 160 and the current signal that is output from the rectifier 150, which are equal. This voltage from the dominant pole node may be input to a transconductance amplifier 140, which converts the voltage signal to a control current signal. This control signal may be received by a current source 130, which adjusts the current signal that it sends to the VCO based on the control current signal.

In some embodiments, an LC VCO may include a coarse calibration feature where the frequency of the VCO may be brought around the final frequency by using a coarse capacitor bank. In an LC VCO fvco=½·pi·sqrt($L_{tank} \cdot C_{tank}$) where $L_{tank}$ is the inductor and $C_{tank}$ is the overall capacitor.

$$C_{tank} = C_{fixed} + C_{var} \qquad \text{EQUATION 1}$$

where $C_{fixed}$ is the tank fixed capacitor including parasitic capacitors and coarse capacitors. $C_{var}$ is the varactor cap which may be used to fine tune the VCO after it has been calibrated using coarse capacitor bank.

Once the calibration of an inductor-capacitor (LC) VCO has been performed, the temperature of the LC VCO may drift causing it to go to some other frequency. This frequency drift may occur for a variety of reasons, some of which may include, but are not limited to, that the varactor temperature coefficient and inductor temperature coefficient that may either be PTAT (proportional to absolute temperature) or CTAT (complementary to absolute temperature). Typically, both are PTAT. In a phase locked loop (PLL), this may depend on the gain of the VCO and the range of the control voltage (Vctrl) that may change $C_{var}$ to address this frequency drift due to temperature drift. If the temperature drift in the varactor and inductor are too high then after coarse calibration, the LC VCO may not be able to perform the fine tuning of this frequency drift and the least significant bit (LSB) error of the coarse calibration. This may lead to an issue with the PLL locking, which was trying to make the LC VCO operate at the desired frequency.

Figure 2:
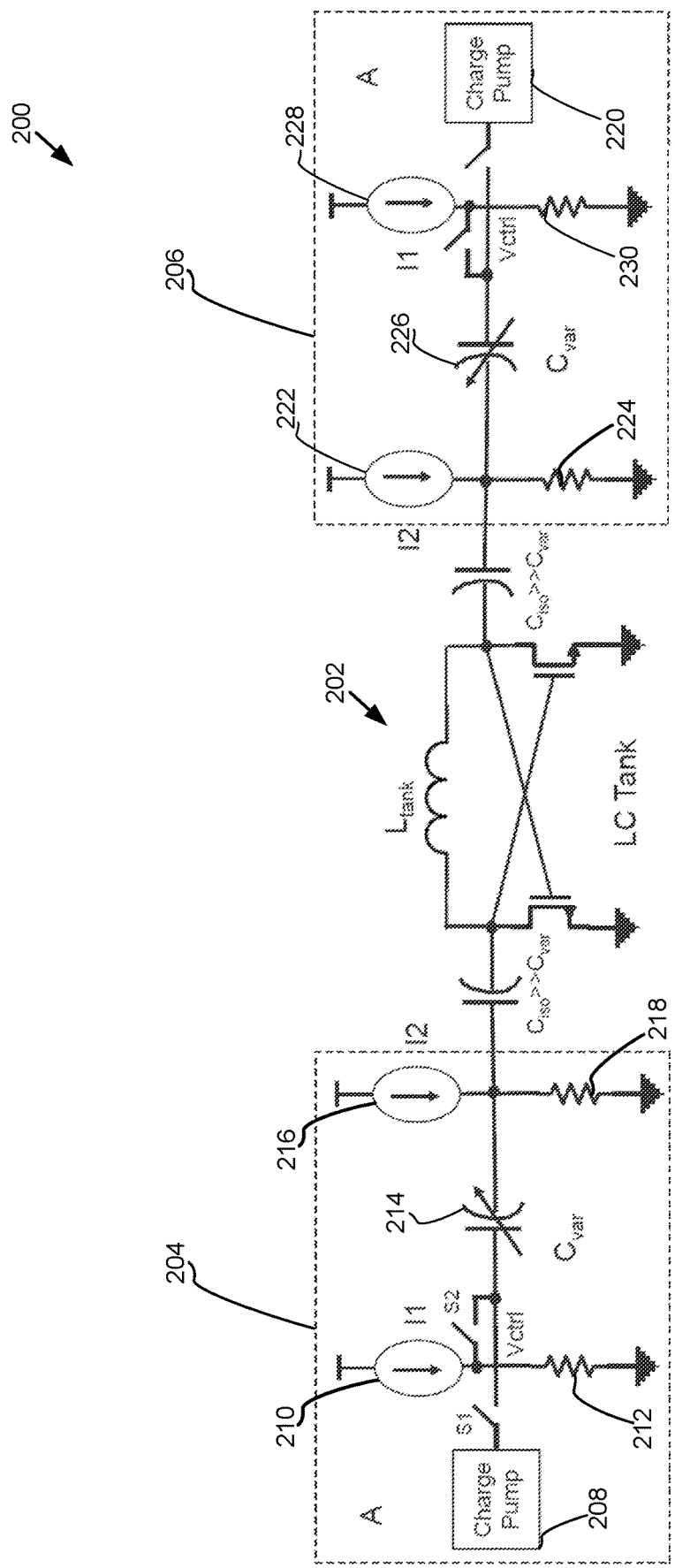
FIG. 2 shows a circuit depicting varactor biasing in a voltage-controlled oscillator consistent with embodiments of the present disclosure.

Referring now to FIG. 2, circuit 200 depicting varactor biasing in a VCO consistent with embodiments of the present disclosure is provided. Circuit 200 may include LC tank 202 operatively connected with two varactor circuits 204 and 206. Varactor circuit 204 may include charge pump 208 operatively connected with first current source 210 and first resistor 212. First varactor 214 may be located between the pair of first current source 210 and first resistor 212, and the pair of second current source 216 operatively connected to second resistor 218. Likewise, varactor circuit 206 may include charge pump 220 operatively connected with third current source 222 and third resistor 224. Second varactor 226 may be located between the pair of third current source 222 and third resistor 224, and the pair of fourth current source 228 operatively connected to fourth resistor 230. One or more switches (e.g., S1, S2, etc.) may be used to create a direct connection between first current source 210 and first varactor 214, or between third current source 222 and second varactor 226. In operation, S1 may be OFF and S2 ON during VCO calibration at startup and S1 may be ON and S2 OFF during the normal functionality of the VCO.

In the example of FIG. 2, I1 and I2 may be derived from Vbg divided by Rpoly (A poly Resistor), so both ends of the varactor may be proportional to Vbg. $C_{iso}$, which may be much greater than $C_{var}$ may be added to allow biasing on both sides of the varactor thereby reducing the frequency spread due to Process, Voltage and Temperature (PVT). When both sides of a varactor are constant and temperature is swept (e.g., from −40 to 125), the varactor may exhibit a PTAT nature so that it has a positive temperature coefficient. This along with the inductor PTAT nature may exacerbate the frequency drift.

Figure 3:
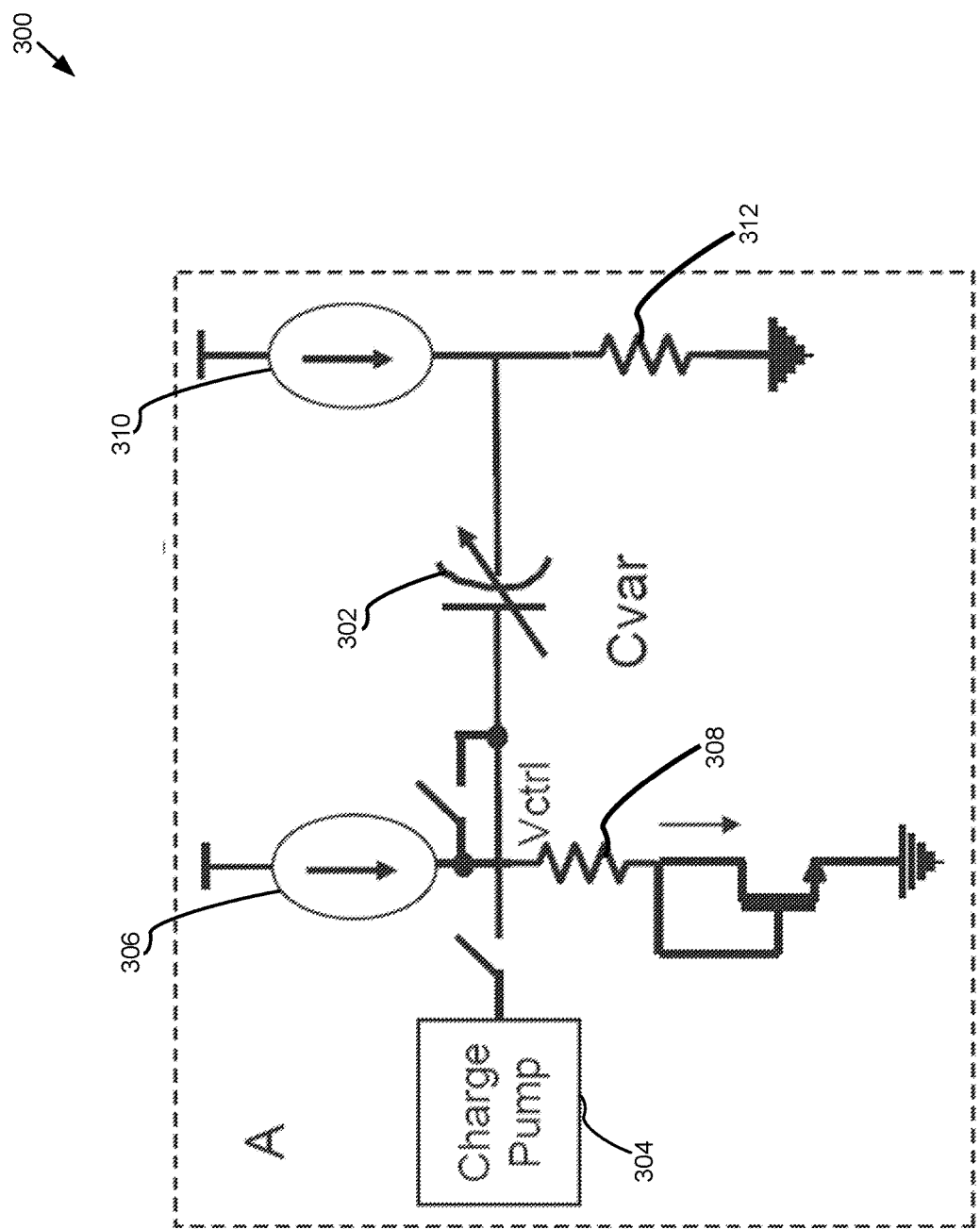
FIG. 3 shows another circuit depicting varactor biasing in a voltage-controlled oscillator consistent with embodiments of the present disclosure.

Referring now to FIG. 3, another varactor circuit 300 depicting varactor 302 biasing in a VCO consistent with embodiments of the present disclosure is provided. Although initially varactor 302 was PTAT, adjusting the left side of varactor 302 to a CTAT results in the overall varactor value becoming CTAT. This CTAT voltage may depend on the Vth n-channel metal-oxide-semiconductor (NMOS) characteristics and the slope of this CTAT may not be easily changed. Varactor circuit 300 may include charge pump 304 operatively connected with first current source 306 and first resistor 308. Varactor 302 may be located between the pair of first current source 306 and first resistor 308, and the pair of second current source 310 operatively connected to second resistor 312.

Figure 4:
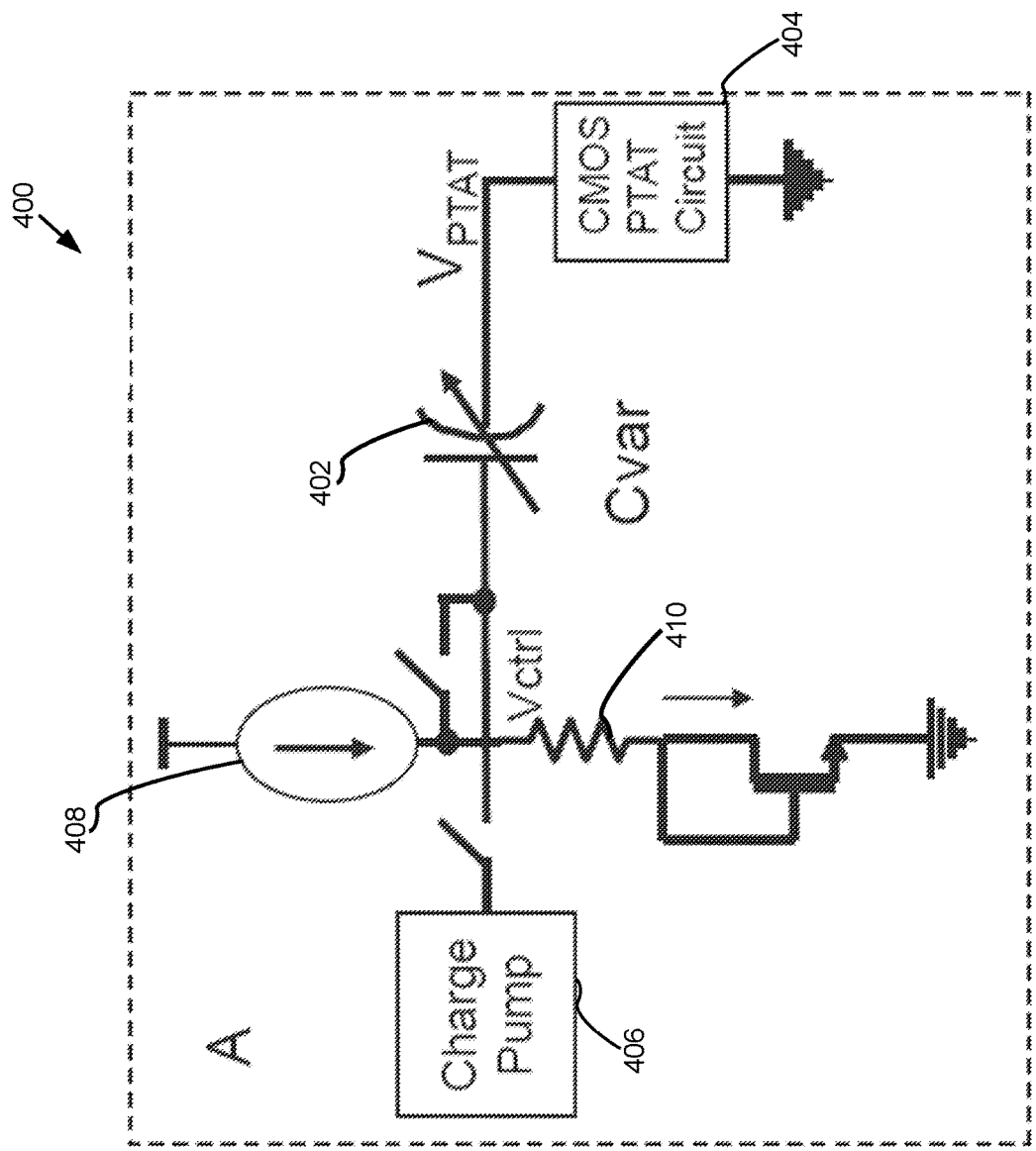
FIG. 4 shows yet another circuit depicting varactor biasing in a voltage-controlled oscillator consistent with embodiments of the present disclosure.

Referring now to FIG. 4, yet another varactor circuit 400 depicting varactor 402 biasing in a VCO consistent with embodiments of the present disclosure is provided. In this particular example, by biasing the right side of varactor 402 to complementary metal-oxide semiconductor (CMOS) PTAT circuit 404, even a higher CTAT may be obtained. This may help to address any inductor drift with temperature and this slope may be programmed also depending on the need. Varactor circuit 400 may include charge pump 406 operatively connected with current source 408 and resistor 410. Varactor 402 may be located between the pair of current source 406 and resistor 408, and CMOS PTAT circuit 404.

Figure 5:
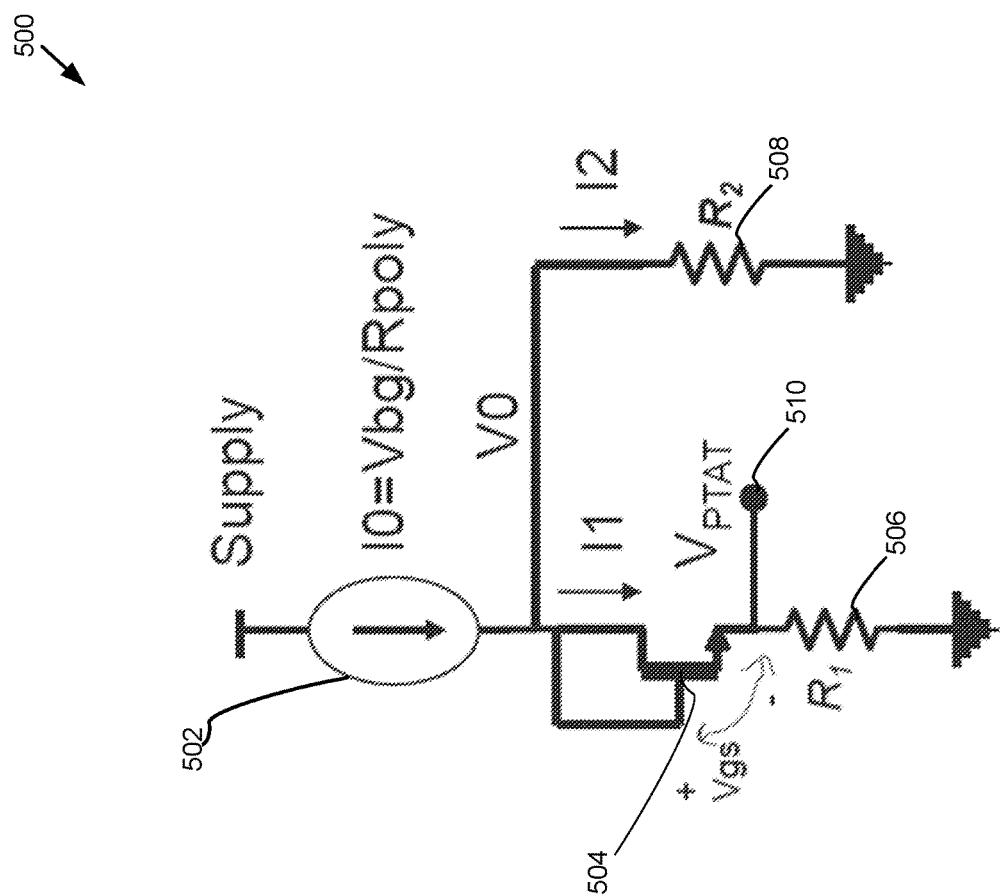
FIGS. 5-7 show exemplary CMOS PTAT circuits consistent with embodiments of the present disclosure.

Referring now to FIG. 5, an exemplary CMOS PTAT circuit 500 consistent with embodiments of the present disclosure is provided. CMOS PTAT circuit 500 may include current source 502 that may be configured to provide a constant bias current, operatively connected to transistor 504 that may be configured to receive a first portion of the constant bias current. CMOS PTAT circuit 500 may also include first resistor 506 operatively connected with transistor 504 and second resistor 508 that may be configured to receive a second portion of the constant bias current. CMOS PTAT circuit 500 may further include node 510, which may be operatively connected with transistor 504 and first resistor 506, such that a voltage proportional to the absolute temperature increases as temperature increases. Most analog IPs have a constant (Temperature Independent) bias current I0 already present. Embodiments of the present disclosure may be used to convert that constant current to a PTAT voltage. Accordingly, when Temperature (T) increases, Vgs reduces as Vgs=Vth (NMOS)+Vov, due to this V0 goes down. Since I2=V0/R2, I2 also goes down, which means I1 goes up, causing VPTAT to go up with temperature.

$$VPTAT = I0 \cdot R1 \cdot R2R1 + R2 - Vgs \cdot R1R1 + R2 \qquad \text{EQUATION 2}$$

In some embodiments, since the Vgs slope is negative (CTAT), the Vptat slope is positive (PTAT) and may be adjusted using relative values of R1 and R2. Accordingly, circuit 500 may require very low area, low power and needs only a bias current=Vbg/Rpoly that is present in all circuits.

Figure 6:
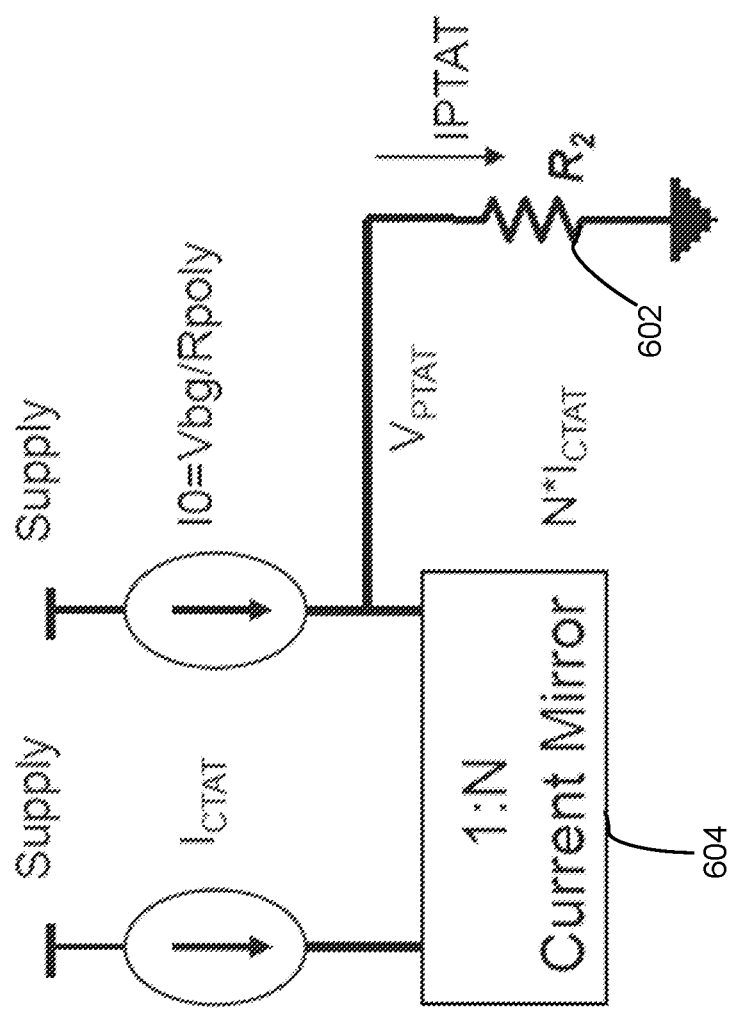
Figure 7:
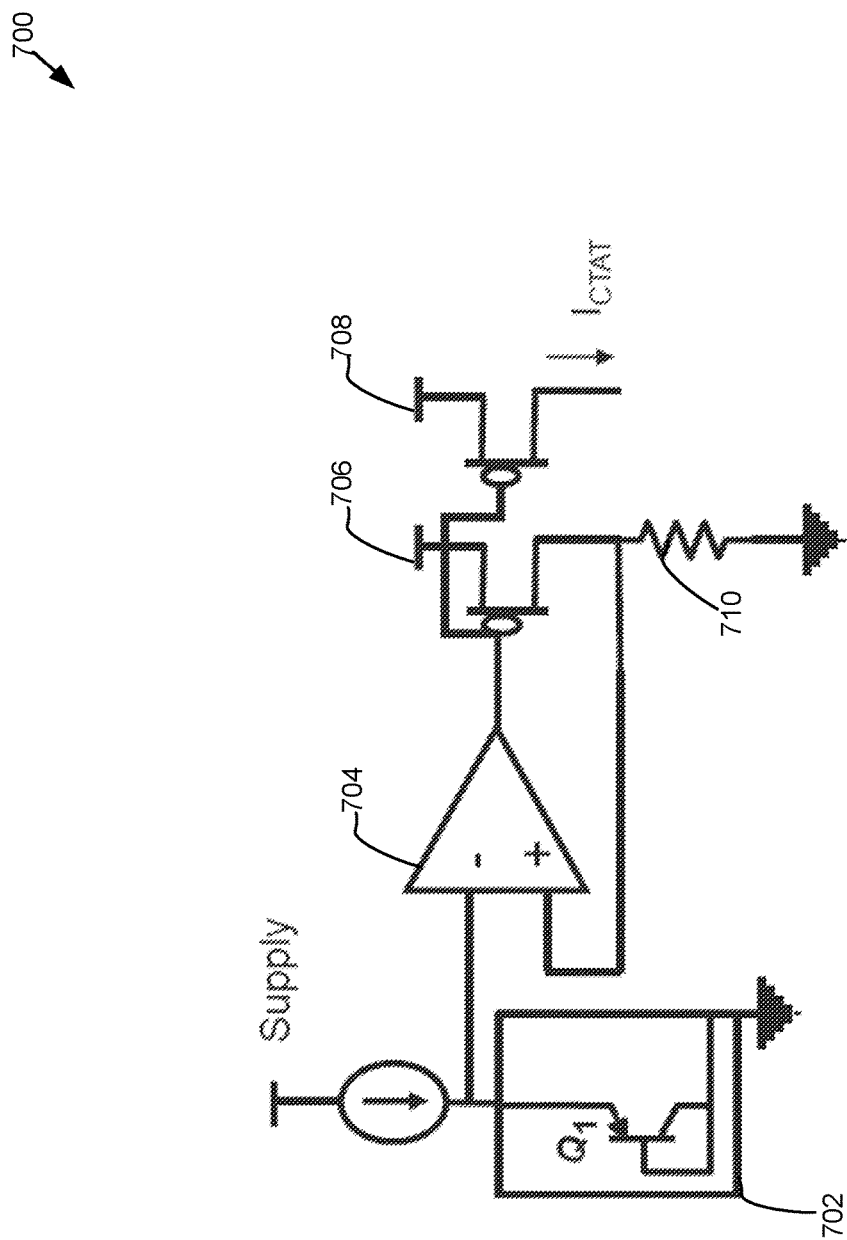

Referring now to FIGS. 6-7, exemplary CMOS PTAT circuits 600, 700 consistent with embodiments of the present disclosure are provided. An ICTAT may be subtracted from a constant bias current (Vbg/Rpoly) then the resultant is IPTAT. If this IPTAT is put across a resistance, such as resistor 602, an VPTAT may be obtained. FIGS. 6-7 depict additional embodiments that may be used to generate a programmable PTAT. For example, programmable current mirror 604 may be configured to multiply the CTAT current to the right by N (programmable) times and thereby increase the CTAT slope also by N times. This may then increase the slope of VPTAT also by N times.

$$VPTAT = I0 - N \cdot ICTAT \cdot R2 \qquad \text{EQUATION 3}$$

In some embodiments, since the ICTAT slope is negative (CTAT), the VPTAT slope is positive (PTAT) and may be programmed using N. ICTAT may be obtained through a VBE/R circuit where VBE is a bipolar base-emitter voltage. The bipolar may be a stand-alone or one of the branches of a bandgap circuit 702.

Figure 8:
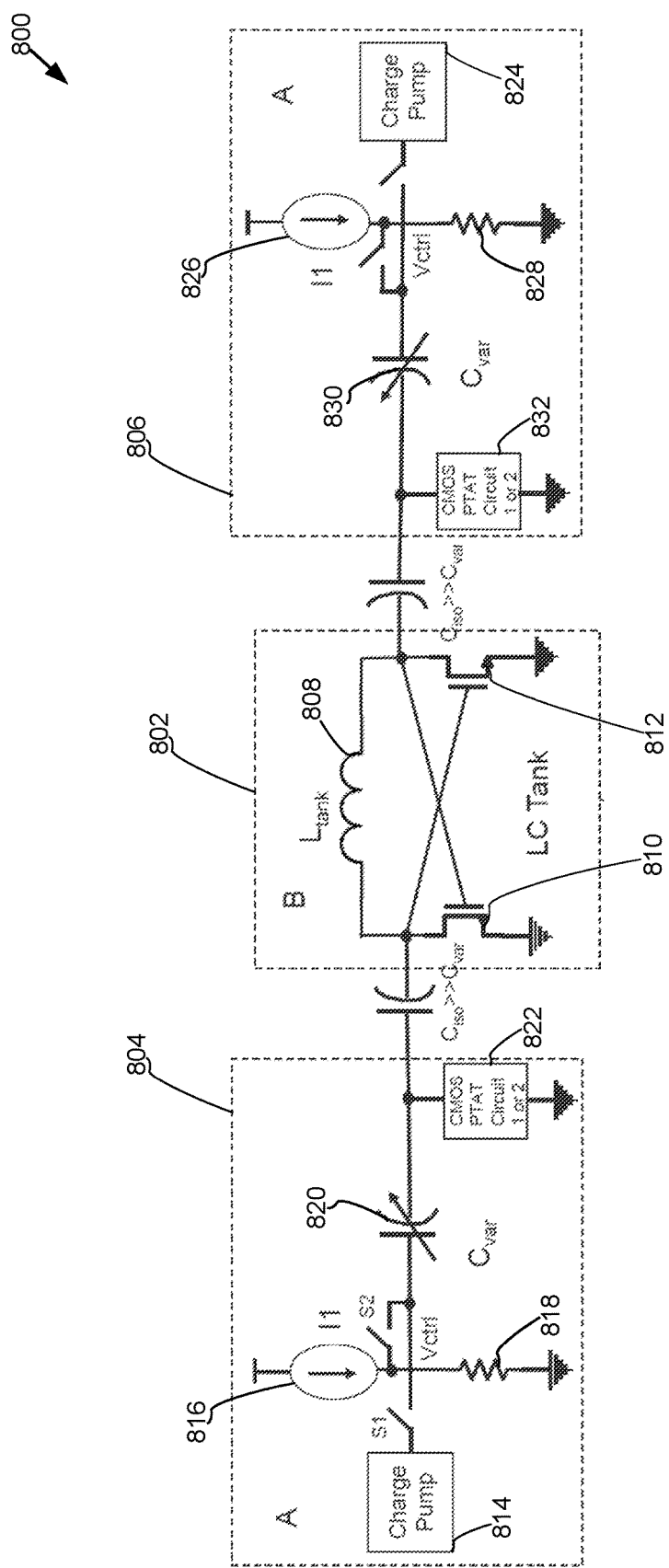
FIGS. 8-9 show additional circuits consistent with embodiments of the present disclosure.
Figure 9:
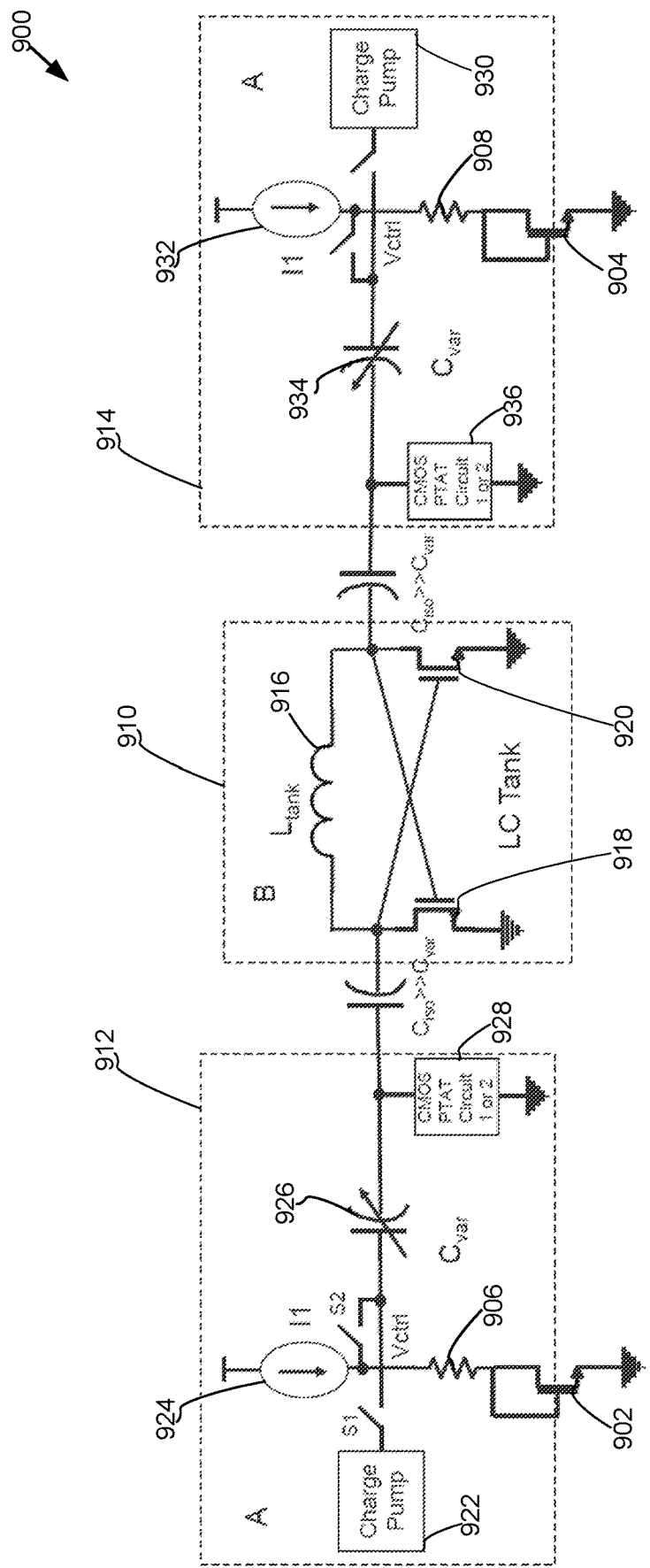

FIGS. 8-9 show additional circuits consistent with embodiments of the present disclosure are provided. FIG. 8 shows a circuit 800, which is similar to the circuit shown in FIG. 2 but may include any of the CMOS PTAT circuits included herein. Circuit 800 may include three varactor circuits 802, 804, 806. Varactor circuit 802 (denoted by "B") may include any LC VCO core architecture having inductor 808 and one or more cross coupled MOS 810, 812. Varactor circuit 804 may include charge pump 814 operatively connected with first current source 816 and first resistor 818. First varactor 820 may be located between the pair of first current source 816 and first resistor 818, and CMOS PTAT circuit 822. Varactor circuit 806 may include charge pump 824 operatively connected with second current source 826 and second resistor 828. Second varactor 830 may be located between the pair of second current source 826 and second resistor 828, and CMOS PTAT circuit 832.

FIG. 9 shows a circuit 900, which is also similar to the circuit shown in FIG. 2 but includes any of the CMOS PTAT circuits included herein as well as additional transistors 902, 904 between first resistor 906 and ground, and between second resistor 908 and ground. Circuit 900 may include three varactor circuits 910, 912, 914. Varactor circuit 910 (denoted by "B") may include any LC VCO core architecture having inductor 916 and one or more cross coupled MOS 918, 920. Varactor circuit 912 may include charge pump 922 operatively connected with first current source 924 and first resistor 906. First varactor 926 may be located between the pair of first current source 924 and first resistor 906, and first CMOS PTAT circuit 928. Varactor circuit 914 may include charge pump 930 operatively connected with second current source 932 and second resistor 908. Second varactor 934 may be located between the pair of second current source 932 and second resistor 908, and second CMOS PTAT circuit 936.

Figure 10:
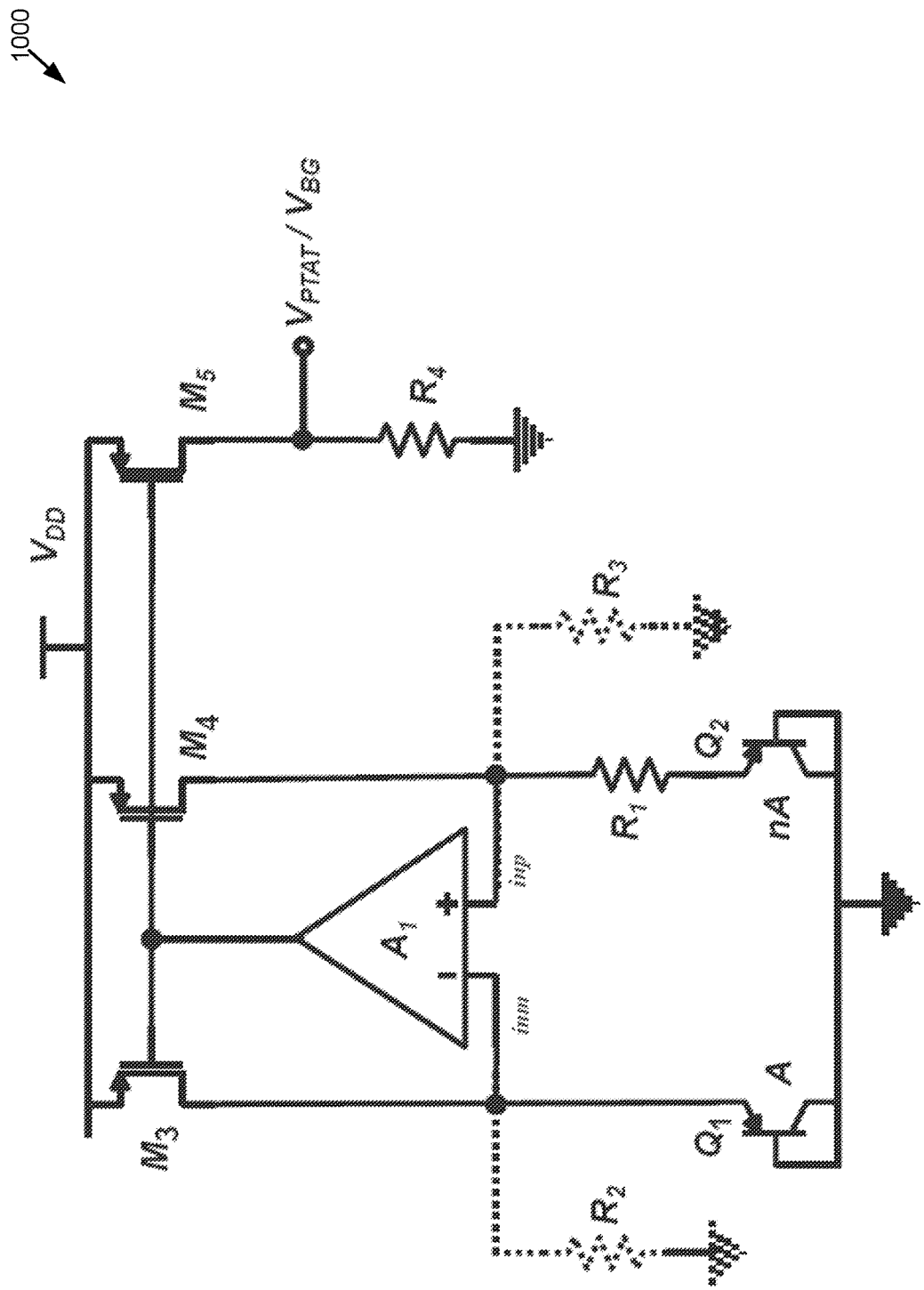
FIG. 10 shows a circuit that illustrates some of the disadvantages of traditional circuits.

FIG. 10 shows circuit 1000 illustrating some of the disadvantages of traditional circuits. To generate a PTAT circuit a bipolar circuit 1000 such as that shown in FIG. 10 may be used. However, circuit 1000 may require significant area as it needs n+1 units of a bipolar-junction transistor (BJT) device, a single unit of which itself is quite large. Although most circuits already have a bandgap circuit in order to generate a temperature compensated Vbg they have added resistors and may become unusable for cancelling varactor temperature coefficient.

Embodiments of the present disclosure may utilize a CMOS PTAT circuit, which may help to address the frequency drift due to temperature of an LC VCO. Circuit 1000 may provide a wide range of PTAT slopes which makes it adaptable to any scenario of temperature coefficients of varactor and inductor in an LC VCO. By choosing a particular slope, the frequency drift may be addressed. This makes it possible for an LC VCO to be used in a PLL without losing lock over a higher temperature range. Programmable PTAT slope with mean value same. By changing the values of R1 and R2, the slope of the PTAT voltage may be varied depending on how much PTAT voltage is required to cancel the effect of inductor and varactor PTAT. Similar curves may be obtained by programming N in various embodiments of the CMOS PTAT circuits described herein.

In some embodiments, and depending on the structure of LC VCO, various ways of biasing the varactor may be selected and employed. It could have either end connected to PTAT/CTAT/constant voltage, in addition to the use of a CMOS PTAT circuit used at either end of the varactor of an LC VCO as described herein.

Referring now to FIG. 11, a flowchart 1100 showing operations consistent with embodiments of the present disclosure is provided. Flowchart 1100 depicts one possible method for use with a programmable circuit. The method may include generating (1102) a constant bias current at a current source and receiving (1104) a first portion of the constant bias current at a transistor. The method may further include providing (1106) a first resistor operatively connected with the transistor and receiving (1108) a second portion of the constant bias current at a second resistor, where a voltage associated with the transistor is reduced as temperature increases. Numerous other operations are also within the scope of the present disclosure.

It will be apparent to those skilled in the art that various modifications and variations can be made in embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A programmable circuit comprising:
   a current source configured to provide a constant bias current;
   a transistor configured to receive a first portion of the constant bias current;
   a first resistor operatively connected with the transistor;
   a second resistor configured to receive a second portion of the constant bias current, where a voltage associated with the transistor is reduced as temperature increases; and
   wherein the programmable circuit receives a current from a secondary current source.

2. The circuit of claim 1, wherein the second portion of the constant bias current is reduced as temperature increases.

3. The circuit of claim 1, wherein the first portion of the constant bias current is increased as temperature increases.

4. The circuit of claim 1, wherein a voltage proportional to absolute temperature at a node operatively connected with the transistor and first resistor increases as temperature increases.

5. The circuit of claim 1, wherein the programmable circuit is operatively connected with a varactor.

6. The circuit of claim 5, wherein the varactor is operatively connected with a third current source and a charge pump.

7. The circuit of claim 5, wherein the varactor is operatively connected with a third resistor that is operatively connected with a second transistor.

8. A method for use with a programmable circuit comprising:
   generating a constant bias current at a current source;
   receiving a first portion of the constant bias current at a transistor;
   providing a first resistor operatively connected with the transistor; and
   receiving a second portion of the constant bias current at a second resistor, where a voltage associated with the transistor is reduced as temperature increases; and
   wherein the programmable circuit receives a current from a secondary current source.

9. The method of claim 8, wherein the second portion of the constant bias current is reduced as temperature increases.

10. The method of claim 8, wherein the first portion of the constant bias current is increased as temperature increases.

11. The method of claim 8, wherein a voltage proportional to absolute temperature at a node operatively connected with the transistor and first resistor increases as temperature increases.

12. The method of claim 8, wherein the programmable circuit is operatively connected with a varactor.

13. A programmable circuit comprising:
   a first current source configured to generate a complementary to absolute temperature current;
   a second current source configured to generate a constant bias current;
   a current mirror configured to receive the complementary to absolute temperature current and a first portion of the constant bias current; and
   a resistor configured to receive a second portion of the constant bias current.

14. The circuit of claim 13, wherein the current mirror is programmable.

* * * * *